US009311988B2

(12) United States Patent
Ono et al.

(10) Patent No.: US 9,311,988 B2
(45) Date of Patent: Apr. 12, 2016

(54) STORAGE CONTROL SYSTEM AND METHOD, AND REPLACING SYSTEM AND METHOD

(75) Inventors: Takatsugu Ono, Kawasaki (JP); Takeshi Shimizu, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 353 days.

(21) Appl. No.: 13/545,073

(22) Filed: Jul. 10, 2012

(65) Prior Publication Data

US 2013/0046943 A1 Feb. 21, 2013

(30) Foreign Application Priority Data

Aug. 15, 2011 (JP) ................. 2011-177710

(51) Int. Cl.
| | |
|---|---|
| *G06F 11/34* | (2006.01) |
| *G11C 11/4076* | (2006.01) |
| *G06F 12/02* | (2006.01) |
| *G06F 12/08* | (2006.01) |
| *G06F 12/12* | (2006.01) |

(52) U.S. Cl.
CPC ........ *G11C 11/4076* (2013.01); *G06F 12/0215* (2013.01); *G06F 12/0862* (2013.01); *G06F 12/126* (2013.01); *G06F 12/123* (2013.01); *G11C 2207/2245* (2013.01); *Y02B 60/1225* (2013.01)

(58) Field of Classification Search
CPC ... G06F 12/123; G06F 3/067; G06F 12/0246; G06F 12/067
USPC ........................................................ 711/158
See application file for complete search history.

(56) References Cited

U.S. PATENT DOCUMENTS

| | | | | |
|---|---|---|---|---|
| 5,452,440 | A | * | 9/1995 | Salsburg ............. G06F 11/3447 711/133 |
| 6,145,065 | A | * | 11/2000 | Takahashi et al. ............ 711/158 |
| 6,542,969 | B1 | * | 4/2003 | Sato .............................. 711/143 |
| 6,799,257 | B2 | | 9/2004 | Sprangle et al. |
| 7,130,967 | B2 | | 10/2006 | Arimilli et al. |

(Continued)

FOREIGN PATENT DOCUMENTS

| | | |
|---|---|---|
| JP | A-6-103169 | 4/1994 |
| JP | A-9-244957 | 9/1997 |

(Continued)

OTHER PUBLICATIONS

Japanese Office Action mailed Oct. 21, 2014 for corresponding Japanese Patent Application No. 2011-177710, with Partial English Translation, 4 pages.

*Primary Examiner* — Adam M Queler
*Assistant Examiner* — Trang Ta
(74) *Attorney, Agent, or Firm* — Fujitsu Patent Center

(57) ABSTRACT

A row buffer 102 in DRAM 100 stores any data read from a memory array 101 in a specified data length unit. An LLC 206 is cache memory, and extracts and stores a part of data stored in the row buffer 102 as cache data. In a MAC 701, when push-out control of the LLC 206 is performed, it is predicted that data at which DIMM address is stored in the row buffer 102 in the near future based on the queuing state of an MRQ 203. In the MAC 701, each physical address of the cache data in a push-out target range 702 on the LLC 206 is converted into a DIMM address. If the converted address matches the predicted address of the data, then the cache data corresponding to the matching addresses is pushed out on a priority basis from the LLC 206.

7 Claims, 11 Drawing Sheets

(56) References Cited

U.S. PATENT DOCUMENTS

| | | | |
|---|---|---|---|
| 2004/0088472 A1* | 5/2004 | Nystuen et al. | 711/5 |
| 2004/0199731 A1 | 10/2004 | Sprangle et al. | |
| 2005/0289319 A1* | 12/2005 | Kang | 711/200 |
| 2009/0187733 A1* | 7/2009 | El-Ghazawi | G06F 15/7867 712/15 |
| 2009/0198910 A1* | 8/2009 | Arimilli | G06F 12/0862 711/141 |
| 2011/0276762 A1* | 11/2011 | Daly et al. | 711/122 |
| 2012/0059983 A1* | 3/2012 | Nellans et al. | 711/105 |

FOREIGN PATENT DOCUMENTS

| | | |
|---|---|---|
| JP | 2000-66946 A | 3/2000 |
| JP | A-2005-174342 | 6/2005 |
| JP | A-2005-518606 | 6/2005 |

\* cited by examiner

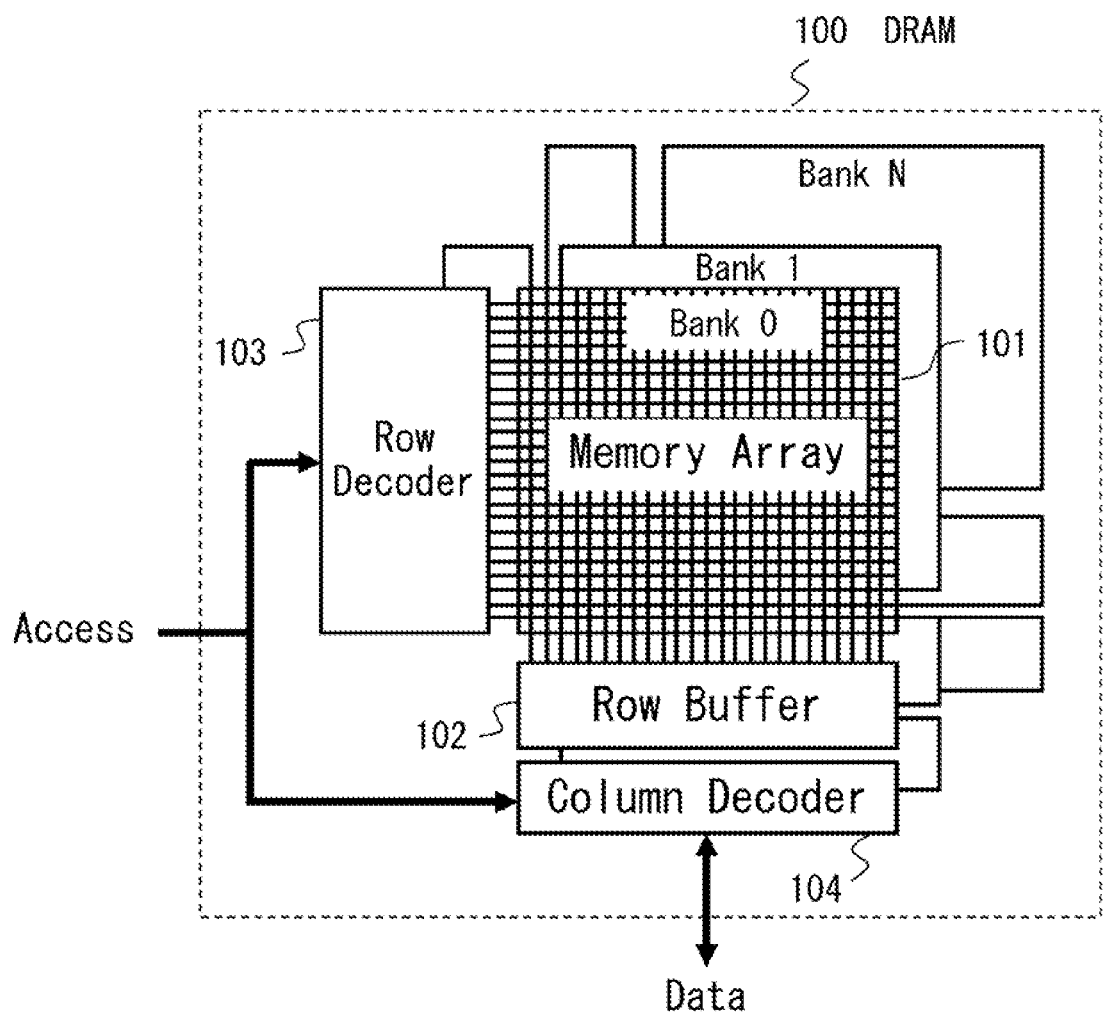
F I G. 1

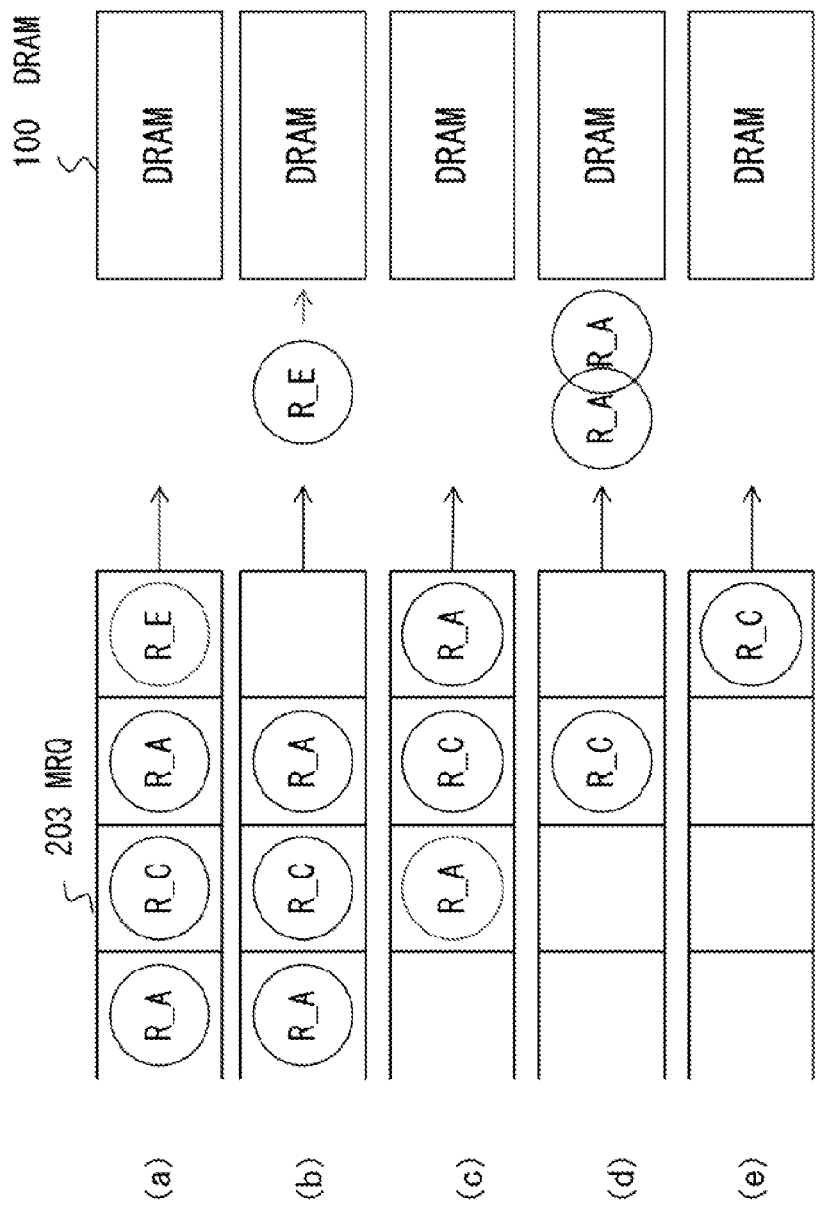
F I G. 4

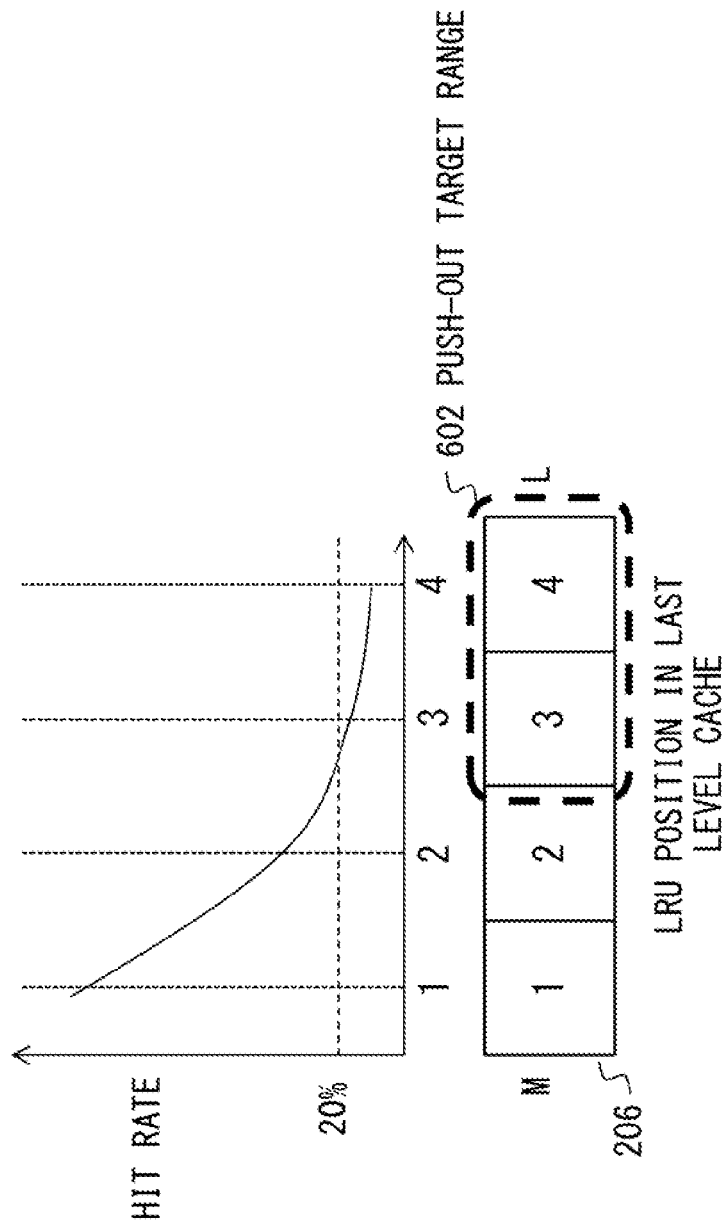
F I G. 1 1

STORAGE CONTROL SYSTEM AND METHOD, AND REPLACING SYSTEM AND METHOD

CROSS-REFERENCE TO RELATED APPLICATION

This application is based upon and claims the benefit of priority of the prior Japanese Patent Application No. 2011-177710, filed on Aug. 15, 2011, the entire contents of which are incorporated herein by reference.

FIELD

The present invention relates to a storage control system and method having a cache function, and a replacing system and method.

BACKGROUND

When data is written to dynamic random access memory (hereafter referred to as "DRAM"), the row address of a corresponding bank (called "row address A" in this specification) is read to a row buffer, and the data is written to the contents specified by a column address. In this case, when the row address is once stored in the row buffer, different column addresses can be accessed in the same row. On the other hand, when it is necessary to access a different row address in the same bank (hereafter referred to as a "row address B"), the row address A in the current row buffer is to be written back, and the row address B is to be stored in the row buffer. The writing operation in the DRAM is called "precharge".

In the request queue in a memory controller, each request is issued on a priority basis in principle in order from the request (memory access request) which has been kept waiting for the longest time in the request queue. To gain access efficiently by making the best of the features of the DRAM above, the scheduling system in which a plurality of requests having the same row address are collectively issued is used. The memory controller determines which row address is to be next stored in the row buffer according to the algorithm above.

The system of pushing out data from the cache according to the prediction of serial addresses or based on the access history, the system of reducing the frequency of main storage access, etc. are proposed. (Patent Documents 1 and 2)

Patent Document 1: Japanese Laid-open Patent Publication No. 9-2444957

Patent Document 2: Japanese Laid-open Patent Publication No. 6-103169

Patent Document 3: Japanese Laid-open Patent Publication No. 2005-518606

Patent Document 4: Japanese Laid-open Patent Publication No. 2005-174342

SUMMARY

An example of the aspect of the present invention includes: a first storage unit that enables to read and write data in a specified data length unit; a second storage unit that reads any piece of the data in the specified data length unit from the first storage unit and stores the data; a third storage unit that extracts and stores a part of data stored in the second storage unit as partial data; and a processor that reads extraction source data of the partial data from the first storage unit, stores the extraction source data in the second storage unit, partially overwrites the extraction source data using the partial data or updated partial data obtained by updating the partial data, and then writes the extraction source data to the first storage unit when the partial data or the updated partial data is deletable from the third storage unit, and when the extraction source data of the partial data is not stored in the second storage unit; partially overwrites the extraction source data of the partial data stored in the second storage unit using the partial data or the updated partial data when the extraction source data of the partial data is stored in the second storage unit, and then writes the data to the first storage unit, and deletes the partial data or the updated partial data whose extraction source data is stored in the second storage unit on the priority basis from the third storage unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a configuration of DRAM;

FIG. 4 is an explanatory view of "first-ready first-come first-serve (FR-FCFS)" as a memory access scheduling algorithm;

FIG. 11 is an explanatory view of the system of determining a push-out target range depending on the feature of cache mishit.

DESCRIPTION OF EMBODIMENTS

A conventional cache memory replacing system lacks the consideration of which row address is stored in the row buffer of DRAM. Therefore, although the row address to be stored in the row buffer in the near future is B, there is a strong possibility that the line to be pushed out from the cache is a row address other than B. In this case, it is necessary that the row address B is once precharged and then other row addresses are stored in the row buffer. Therefore, the conventional scheduling system has the problem that the push-out control of cache increases the frequency of precharge in the memory, thereby increasing the power consumption.

Thus, an aspect of the present invention is to reduce the frequency of precharge, and consequently to reduce the power consumption.

The embodiment of the present invention is described below in detail with reference to the attached drawings.

FIG. 1 is a configuration of DRAM.

A row buffer 102 (described as "Row Buffer" in FIG. 1 and the subsequent drawings) is connected to a memory array (described as "Memory Array" in FIG. 1 and the subsequent drawings) 101. A row decoder (described as "Row Decoder" in FIG. 1 and the subsequent drawings) 103 is connected to the memory array 101. Furthermore, a column decoder 104 (in FIG. 1 and the subsequent drawings) is connected to the row buffer 102. The row buffer 102 has the storage capacity of, for example, 1024 through 2048 bytes.

In reading the DRAM access (described as "Access" in FIG. 1), the row decoder 103 is accessed to store a request page data in the row buffer 102. Then, the column decoder 104 is accesses and the request data (described as "Data" in FIG. 1) in the row buffer 102 is accessed. When the DRAM access is a read request, the accessing operation is an operation of reading the request data in the row buffer 102. On the other hand, when the DRAM access is a write request, the operation is to overwrite data to be written on the request data in the row buffer 102.

Next, in writing the DRAM access, when the data to be accessed in the row buffer 102 has the same row address as already stored data, the data in the row buffer 102 is accessed and the request data is written to the memory array 101. On the other hand, if an address other than the address of the data stored in the row buffer 102 is accessed, the operation of writing back the data in the row buffer 102 to the memory array 101 is performed. The write back operation is called precharge. After the write-back operation, necessary page data is stored in the row buffer 102, and then the data stored in the row buffer 102 is accessed.

The above-mentioned configuration is implemented for each of a plurality of banks (described as "Bank 0", "Bank 1", ..., "Bank N" etc. in FIG. 1). That is, in the DRAM, parallel access can be performed through the row buffer 102, the row decoder 103, and the column decoder 104 corresponding to the memory array 101 for each bank.

Figure 2:
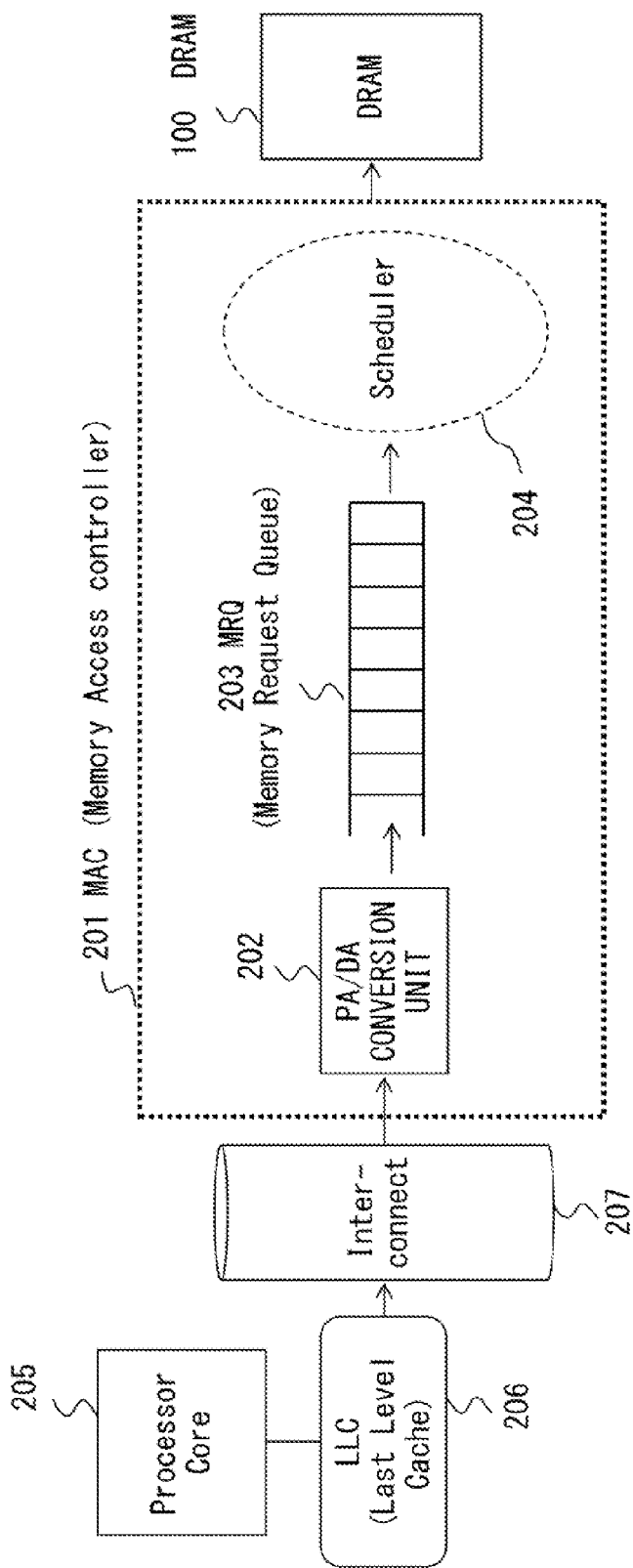
FIG. 2 is a configuration of a common memory access controller.

FIG. 2 is a general configuration of a memory access controller (described as "MAC (Memory Access Controller)" in FIG. 2, and hereafter referred to as "MAC") 201 to access DRAM 100 in FIG. 1. The MAC 201 is connected to an LLC 206 (described as "Last Level Cache" in FIG. 2) through an interconnect (described as "Interconnect" in FIG. 2) 207. The LLC 206 is cache memory at the last stage (closest to the DRAM 100) connected to a processor core 205, and has the storage capacity of, for example, 256 through 512 bytes. The MAC 201 includes a PA/DA conversion unit 202, a memory request queue (described as "MRQ" (Memory Request Queue) in FIG. 2, and hereafter referred to as "MRQ"), and a scheduler (described as "Scheduler") 204. The PA/DA conversion unit 202 converts the physical address (hereafter abbreviated as "PA") issued by the LLC 206 into a DIMM (Dual Inline Memory Module) address (hereafter abbreviated as "DA"). The MRQ 203 queues (temporarily stores) addresses DA sequentially output from the PA/DA conversion unit 202 for the specified maximum number of addresses. The address DA group queued in the MRQ 203 is read on a specified rule by the scheduler 204, and the DRAM 100 is accessed by the read address DA. The accessing system is illustrated in FIG. 1.

Figure 3:
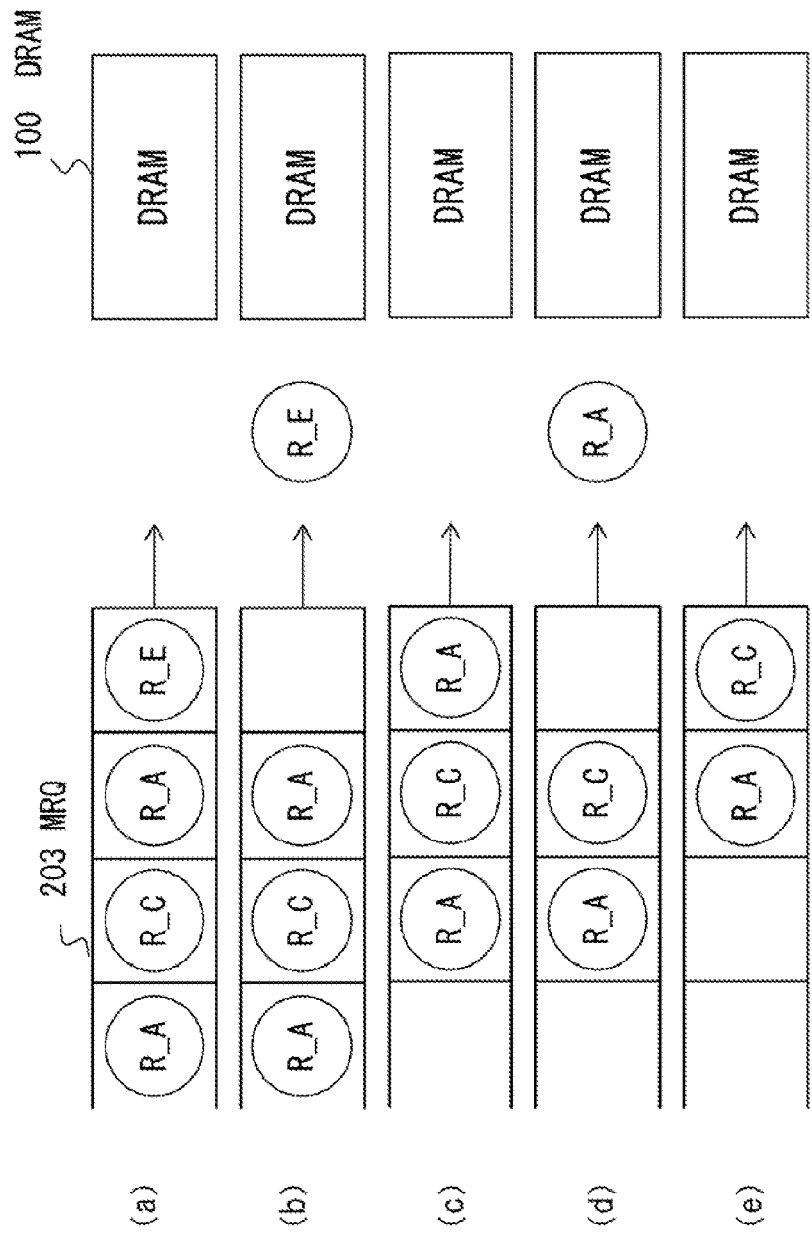
FIG. 3 is an explanatory view of "first-come first-serve (FCFS)" as a memory access scheduling algorithm.

FIG. 3 is an explanatory view of a "first-come first-serve (hereafter abbreviated as FCFS)" system as the first system of a memory access scheduling algorithm embodied by the scheduler 204 illustrated in FIG. 2. Assume that, for example, row addresses R_E, R_A, R_C, and R_A are queued in the MRQ 203 in FIG. 2 as row addresses to be assigned to the row decoder 103 in FIG. 1 in the order of reception from the LLC 206 in FIG. 2 as illustrated in FIG. 3(a). In this case, in the FCFS system, the scheduler 204 accesses the DRAM 100 in the order of reception of row addresses. That is, first, as illustrated in FIG. 3(b), the row address R_E which has first received is retrieved, and assigned to the row decoder 103 (FIG. 1) in the DRAM 100. As a result, the data corresponding to the row address R_E is opened from the memory array 101 in the DRAM 100 to the row buffer 102 (FIG. 1), and the request address in the page data is accessed. Then, the row address group R_A, R_C, and R_A remaining in the MRQ 203 is sequentially filled as the header. Then, as illustrated in FIG. 3(d), the row address R_A which has been received second is retrieved, and assigned to the row decoder 103 in the DRAM 100. As a result, the data corresponding to the row address R_A is opened from the memory array 101 in the DRAM 100 to the row buffer 102, and the request address in the page data is accessed. Then, the row address group R_C and R_A remaining in the MRQ 203 is sequentially filled as the header as illustrated in FIG. 3(e). Hereafter, the similar process is repeated.

FIG. 4 is an explanatory view of first-ready first-come first-serve (hereafter abbreviated as "FR-FCFS") as the second system of the memory access scheduling algorithm embodied by the scheduler 204 in FIG. 2. Assume that, for example, row addresses R_E, R_A, R_C, and R_A are queued in the MRQ 203 in FIG. 2 as row addresses to be assigned to the row decoder 103 in FIG. 1 in the order of reception from the LLC 206 in FIG. 2 as illustrated in FIG. 4(a) as with FIG. 3(a). In this case, in the FR-FCFS system, the scheduler 204 accesses the DRAM 100 in the order of reception of row addresses as with the FCFS system with reference to FIG. 3. That is, first, as illustrated in FIG. 4(b), the row address R_E which has first received is retrieved, and assigned to the row decoder 103 in the DRAM 100. As a result, the page data corresponding to the row address R_E is opened from the memory array 101 in the DRAM 100 to the row buffer 102, and the request address in the page data is accessed. Then, the row address group R_A, R_C, and R_A remaining in the MRQ 203 is sequentially filled as the header as illustrated in FIG. 4(c). Then, the row address R_A which has been received second is retrieved. However, as illustrated in FIG. 4(d), when there is the same row address in the MRQ 203, the row address R_A is issued immediately to the DRAM 100. Then, after the first row address R_A is issued to the row decoder 103 in the DRAM 100, the page data corresponding to the row address R_A is opened from the memory array 101 in the DRAM 100 to the row buffer 102, and the request address in the page data is accessed. Furthermore, as for the second row address R_A, the page data corresponding to the R_A has already been opened to the row buffer 102. Therefore, the operation of opening the page data corresponding to R_A from the memory array 101 to the row buffer 102 again is not performed, but the request address in the row buffer 102 is immediately accessed. Then, the row address R_C remaining in the MRQ 203 is filled as the header as illustrated in FIG. 4(e). Then, the similar process is repeated. As described above, in the FR-FCFS system, by the same row addresses in the MRQ 203 collectively issued to the DRAM 100, a high-speed read/write process can be realized.

Figure 5:
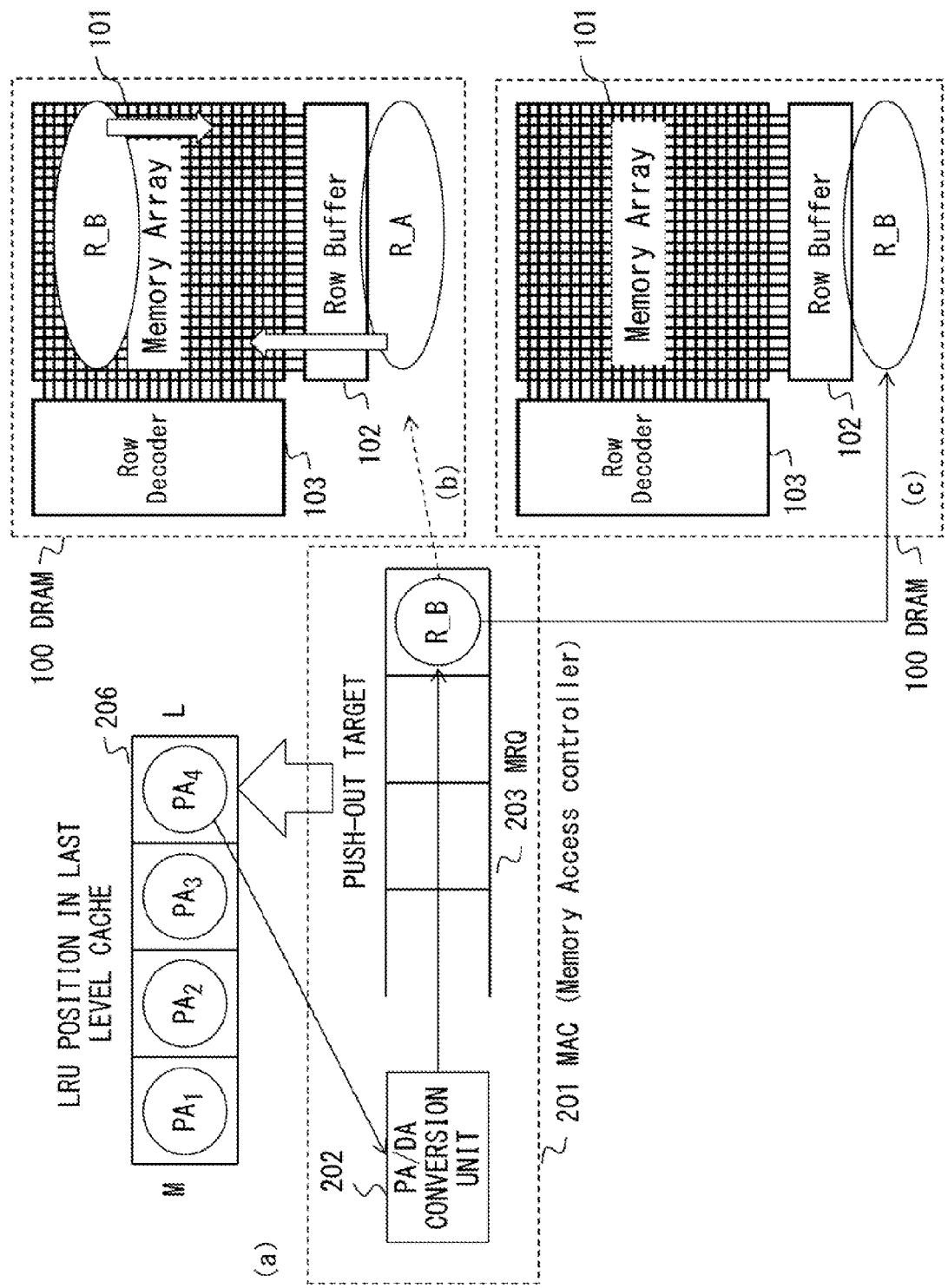
FIG. 5 is an explanatory view of a general cache line replacing system.

Described next is the memory access scheduling process in the FR-FCFS system including the process of replacing a cache line in the LLC 206 in FIG. 2. FIG. 5 is an explanatory view of the general system of replacing a cache line. First, an LRU (least recently used) policy is generally used as a replacing policy of a cache line in the LLC 206. In each cache way in the cache block being accessed in the LRU policy, the cache data of the cache way which has been least used lately is replaced. In the LRU policy, each cache way on the cache memory is managed as an LRU position in the order of access frequency to each cache data. Then, the cache data of the cache way closest to the L side in the LRU position (no access for the longest time) is pushed out from the LLC 206 to the DRAM 100. In the MAC 201, the PA/DA conversion unit 202 (FIG. 2) converts the pushed out physical address PA into the DIMM address DA which is stored in the MRQ 203. In the example in FIG. 5(*a*), it is first determined that the cache data corresponding to the pushed out physical address PA4 is the data corresponding to the row address R_B. As illustrated in FIG. 5(*b*), it is assumed that the page data corresponding to the row address R_A is being opened to the row buffer 102. In this case, there is no page data in the row buffer 102 corresponding to the row address R_B to be issued. Therefore, no matching result, that is, row buffer mishit, occurs. In this case, as illustrated in FIG. 5(*b*), the page data corresponding to the row address R_A in the row buffer 102 is precharged to the memory array 101. Then, as illustrated in FIG. 5(*c*), it is necessary to open the page data corresponding to the row address R_B from the memory array 101 to the row buffer 102.

Since the process of replacing a cache line is not generally linked to the memory access scheduling process in the FR-FCFS system, the push-out control of a cache line raises the frequency of the precharge in the DRAM 100, thereby increasing the power consumption.

In the example above, the problem which occurs when the LRU is used as a replacing policy of a cache line is described. However, although a replacing policy other than the LRU is used, a similar problem will occur unless the replacing process is linked with the memory access scheduling process. In addition, in the example above, the physical address PA is processed in the LLC 206, and it is assumed that the conversion from a logical address to a physical address is performed in the cache in the upper layer. However, the problem is not limited to what is described above, but a similar problem can occur. In FIG. 5, the push-out of a physical address PA from the LLC 206 is illustrated, but practically the data stored in the position indicated by the PA is pushed out.

Figure 6:
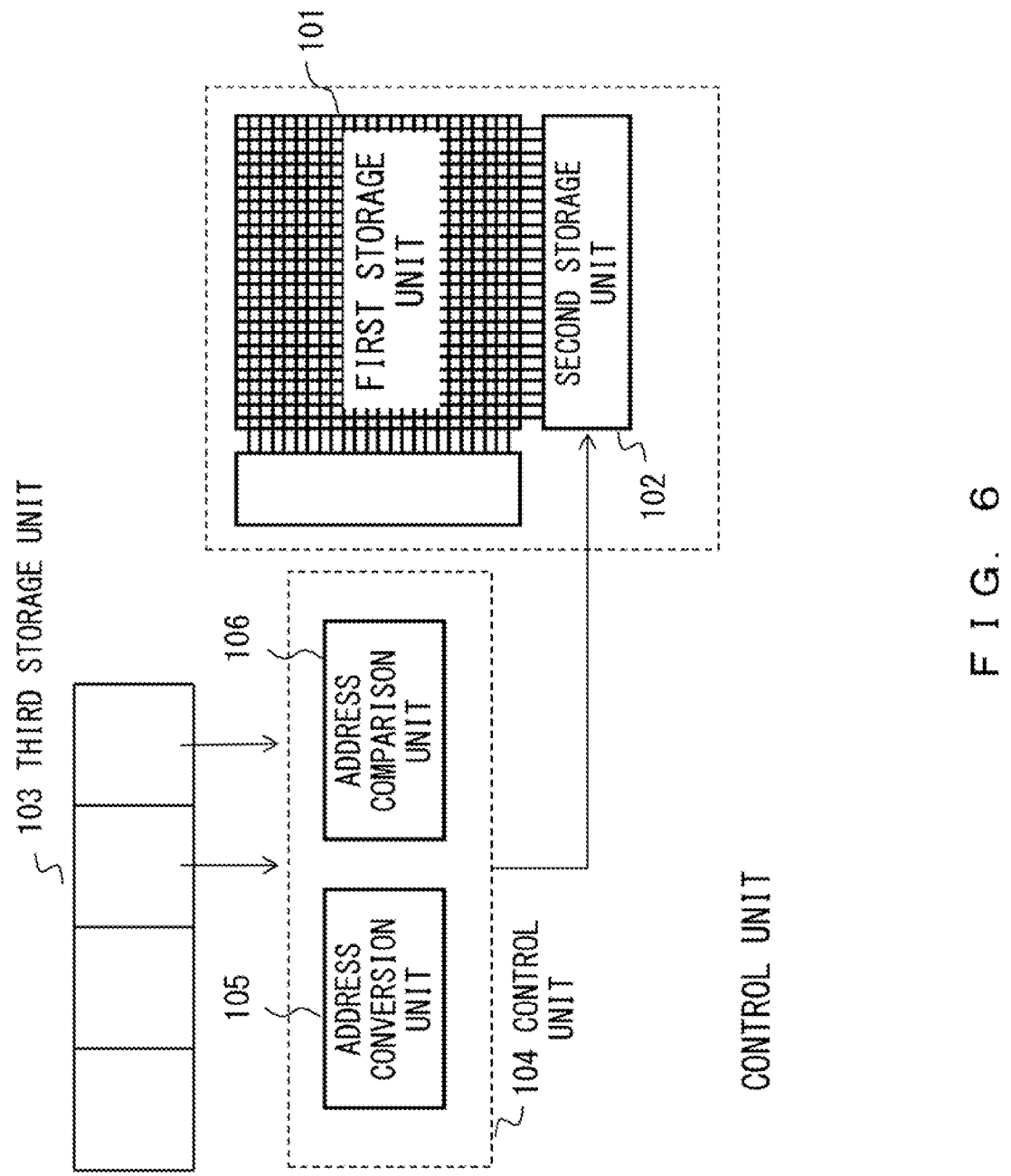
FIG. 6 is a first block diagram according to an embodiment of the present invention.

To solve the above-mentioned problems, the precharge frequency is reduced by the following linkage control in the cache line replacing process and the memory access scheduling process according to an embodiment of the present invention. FIG. 6 is a first block diagram of the present embodiment for solving the above-mentioned problems.

A first storage unit 101 can read and write data in a specified data length (for example, 1024 through 2048 bytes) unit. The first storage unit 101 is, for example, a memory array of DRAM.

A second storage unit 102 reads any data in the above-mentioned specified data length unit from the first storage unit 101, and stores the data. The second storage unit 102 is, for example, a row buffer.

A third storage unit 103 extracts apart of the data stored in the second storage unit 102 as partial data, and stores the data. The third storage unit 103 is, for example, cache memory such as, LLC, etc.

A control unit 104 performs the following operations. First, the control unit 104 performs the following operations when the partial data or the updated partial data obtained by updating the partial data can be deleted, that is, pushed out, from the third storage unit 103. The deletion of the data is to push out the cache data of the cache way of the LLC which has not been accessed for the longest time under the control of the LRU from the LLC to, for example, the first storage unit 101 as DRAM when the third storage unit 103 is, for example, the LLC. When the extraction source data of the partial data is not stored in the second storage unit 102, the control unit 104 reads the extraction source data of the partial data from the first storage unit 101, and stores the data in the second storage unit 102. Then, the control unit 104 partially overwrites the data stored in the second storage unit 102 using the partial data or the updated partial data which can be deleted from the third storage unit 103, and then writes the data in the second storage unit 102 to the first storage unit 101. On the other hand, when the extraction source data of the partial data is stored in the second storage unit 102, the control unit 104 partially overwrites the data stored in the second storage unit 102 using the partial data or the updated partial data which can be deleted from the third storage unit 103. Then, the control unit 104 writes the overwritten data on the second storage unit 102 to the first storage unit 101.

In this case, the control unit 104 deletes from the third storage unit 103 on the priority basis the partial data or the updated partial data whose extraction source data is stored in the second storage unit 102. To be more practical, for example, the following operations are performed. First, assume that the third storage unit 103 stores the first and second oldest data which was last written or updated by the processor etc. Then, assume that the extraction source data of the first data or the extraction source data of the second data is stored in the second storage unit 102. In this case, the control unit 104 selects as the data which can be deleted on the priority basis the data corresponding to the extraction source data stored in the second storage unit 102 from between the first and second data.

With the configuration according to the present embodiment in FIG. 6, for example, the partial data or the updated partial data whose extraction source is the data stored in the second storage unit 102 as a row buffer can be deleted from, for example, the third storage unit 103 as cache memory. Thus, without writing back the data on the second storage unit 102 as a row buffer temporarily to, for example, the first storage unit 101 as a memory array, the data on the second storage unit 102 can be immediately overwritten by the data which can be deleted from the third storage unit 103. Then, the data which is overwritten on the second storage unit 102 can be immediately written back to the first storage unit 101. Thus, the transmission and reception of waste data can be reduced between, for example, the first storage unit 101 as a memory array and, for example, the second storage unit 102 as a row buffer. Thus, efficient memory access is realized, thereby contributing to lower power consumption of the system.

Figure 7:
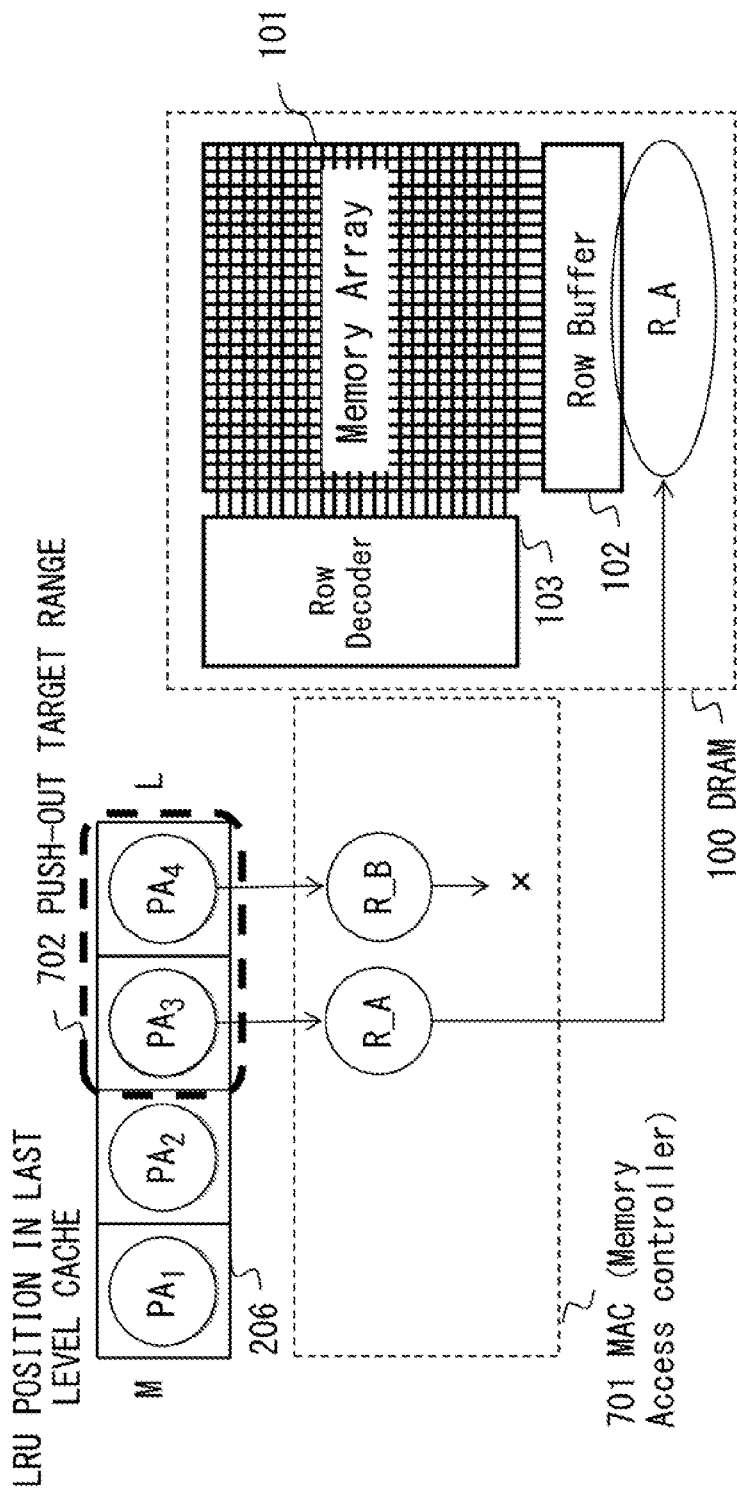
FIG. 7 is an explanatory view (1) of the cache line replacing system according to an embodiment of the present invention.

FIG. 7 is an explanatory view (1) of the cache line replacing system according to the present embodiment. In the present embodiment, first in managing the LRU position in the LLC 206 as illustrated in FIG. 2, a monitor range of a push-out target range 702 is defined. Then, using the function of the PA/DA conversion unit in the control unit additionally implemented in the improved MAC 701, a corresponding DIMM address DA (row addresses R_A, R_B in FIG. 7) is determined from the physical address group PA (PA3, PA4 in FIG. 7) in the push-out target range 702. Then, the determined DA is compared with the row buffer 102. As a result, in the example in FIG. 7, it is detected that the row address R_A in the row buffer 102 matches the row address R_A in the push-out target range 702 determined in the MAC 701. Based on the detection result, the cache line corresponding to the physical address PA3 in the push-out target range 702 of the LLC 206 is pushed out. Thus, according to the common LRU replacing policy, the physical address PA4 closest to the L side is to be pushed out, but actually the physical address PA3 corresponding to the row address R_A of the current row buffer 102 is pushed out. As a result, the row address R_A corresponding to the physical address PA3 is input to the row decoder 102, and while the address line corresponding to the row address R_A is charged, that is, while the address is opened, the memory array 101 is accessed without precharge, and the data specified by R_A is stored.

Figure 8:
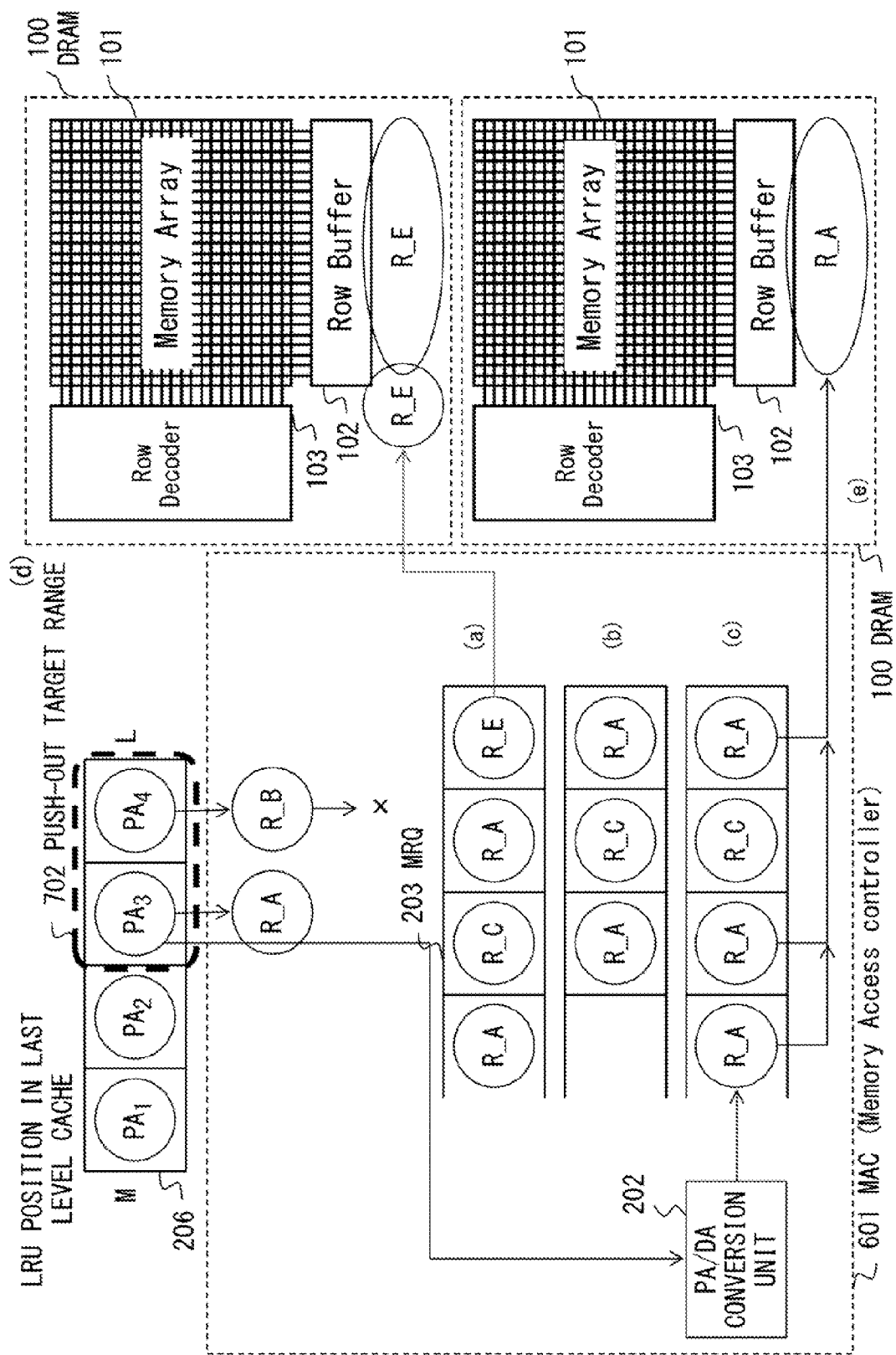
FIG. 8 is an explanatory view (2) of the cache line replacing system according to an embodiment of the present invention.

FIG. 8 is an explanatory view (2) of the cache line replacing system for explanation of a practical control according to an embodiment of the present invention. In the practical process of the present embodiment, in the improved MAC 701, in the procedure as illustrated in FIG. 4(a) through (c), and in FIGS. 8(a) and (b), the memory access scheduling process in the FR-FCFS system is performed. As a result, first illustrated in FIG. 8(d), the page data corresponding to the row buffer 102 is accessed for the leading row address R_E in the MRQ 203, and then it is predicted that the row address to be next accessed in the MRQ 203 is R_A. As a result, the page data corresponding to the row address R_A is input to the row buffer 102 as illustrated in FIG. 8(e). At this time point, using the function of the PA/DA conversion unit in the control unit additionally implemented in the improved MAC 701, the row addresses R_A and R_B corresponding to the physical addresses PA3 and PA4 in the push-out target range 702 in the LLC 206 are determined. As a result, it is detected that the row address R_A matches the row address R_A to be next accessed in the MRQ 203. Based on the detection result, the physical address PA3 in the push-out target range 702 of the LLC 206 is pushed out. The pushed out physical address PA3 is converted from the physical address PA3 to the row address R_A as a DIMM address by the PA/DA conversion unit 202 (FIG. 2) originally provided in the MAC 701, and queued in the MRQ 203. Thus, while the physical address PA4 closest to the L side is pushed out according to the common LRU replacing policy, the physical address PA3 corresponding to the row address R_A of the current row buffer 102 is pushed out. As a result, as illustrated in FIG. 8(c), the data to be stored in the row buffer 102 while the row addresses are opened is sequentially overwritten collectively by the FR-FCFS process for the three row addresses R_A queued in the MRQ 203. Thus, three row addresses R_A can be sequentially accessed by only one precharge.

Figure 9:
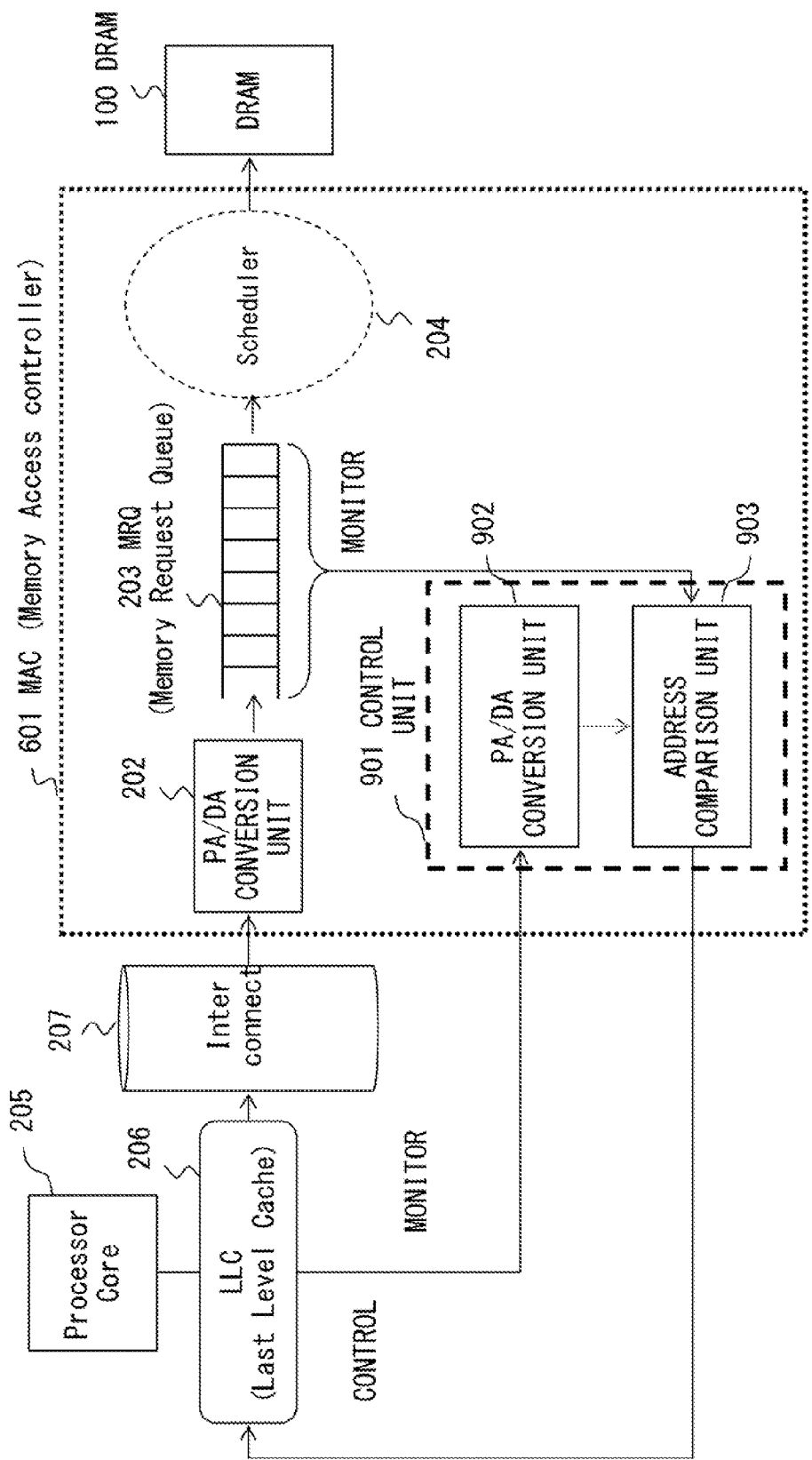
FIG. 9 is a second block diagram according to an embodiment of the present invention.

FIG. 9 is a second block diagram for realizing the controlling process in FIG. 8 according to an embodiment of the present invention. In FIG. 9, the component for performing the same process as the general configuration of the memory access controller in FIG. 2 is assigned the same reference numeral. The difference of the improved MAC 701 in FIG. 9 from the MAC 201 in FIG. 2 is that the MAC 701 is provided with a control unit 901. The control unit 901 includes a PA/DA conversion unit 902 as an address conversion unit, and an address comparison unit 903. The control unit 901 first predicts which row buffer 102 (FIG. 1) is to be opened in the near future from the MRQ 203. The predicting process is performed based on the above-mentioned FR-FCFS scheduling policy (FIG. 4). Next, the PA/DA conversion unit 902 in the control unit 901 monitors the push-out target range 702 (FIG. 8) at the LRU position of the LLC 206, and converts each physical address PA in the range into the DIMM address DA. In this case, for example, the physical addresses PA closest to the L side of the LRU position in the push-out target range 702 are sequentially converted into the DIMM address DA. The address comparison unit 903 inputs one by one the DIMM addresses DA converted by the PA/DA conversion unit 902, and compares the input DIMM address DA with the DIMM address DA predicted as being opened in the near future on the MRQ 203. Then, when the address comparison unit 903 detects the matching result of the DIMM addresses DA, it nullifies the cache data of the physical address at the LRU position corresponding to the DIMM address DA in the LLC 206. The physical address of the LRU position is, for example, assigned a dirty bit and updated, and corresponding data is to be written at the address of the DRAM 100. Thus, in the LLC 206, the physical address of the LRU position corresponding to the DIMM address DA for which the above-mentioned matching result has been detected is pushed out. If no matching is detected, the push-out control is performed based on the normal LRU policy in the LLC 206.

With the configuration according to the embodiment illustrated in FIG. 9, the physical address on the LLC 206 corresponding to the DIMM address DA (row address) which is queued in the MRQ 203 and can be opened to the row buffer 102 on the DRAM 100 in the near future is pushed out on a priority basis. Thus, the DIMM address DA pushed out from the LLC 206 and queued in the MRQ 203 in the MAC 701 is handled in the accessing process collectively with the DIMM address DA to be opened in the near future in the MRQ 203 under the control of the FR-FCFS. The accessing process is sequentially performed while the DIMM address DA to be opened in the near future is opened if it is opened. That is, according to the present embodiment, while the row buffer 102 is opened, the data having the same DIMM address DA as the opened data is pushed out from the LLC 206, and overwritten to the row buffer 102. As a result, plural pieces of data on the MRQ 203 including the data having the same DIMM address DA and pushed out from the LLC 206 are collectively handled in the accessing process on the row buffer 102, thereby reducing the precharge frequency in the DRAM 100.

Figure 10:
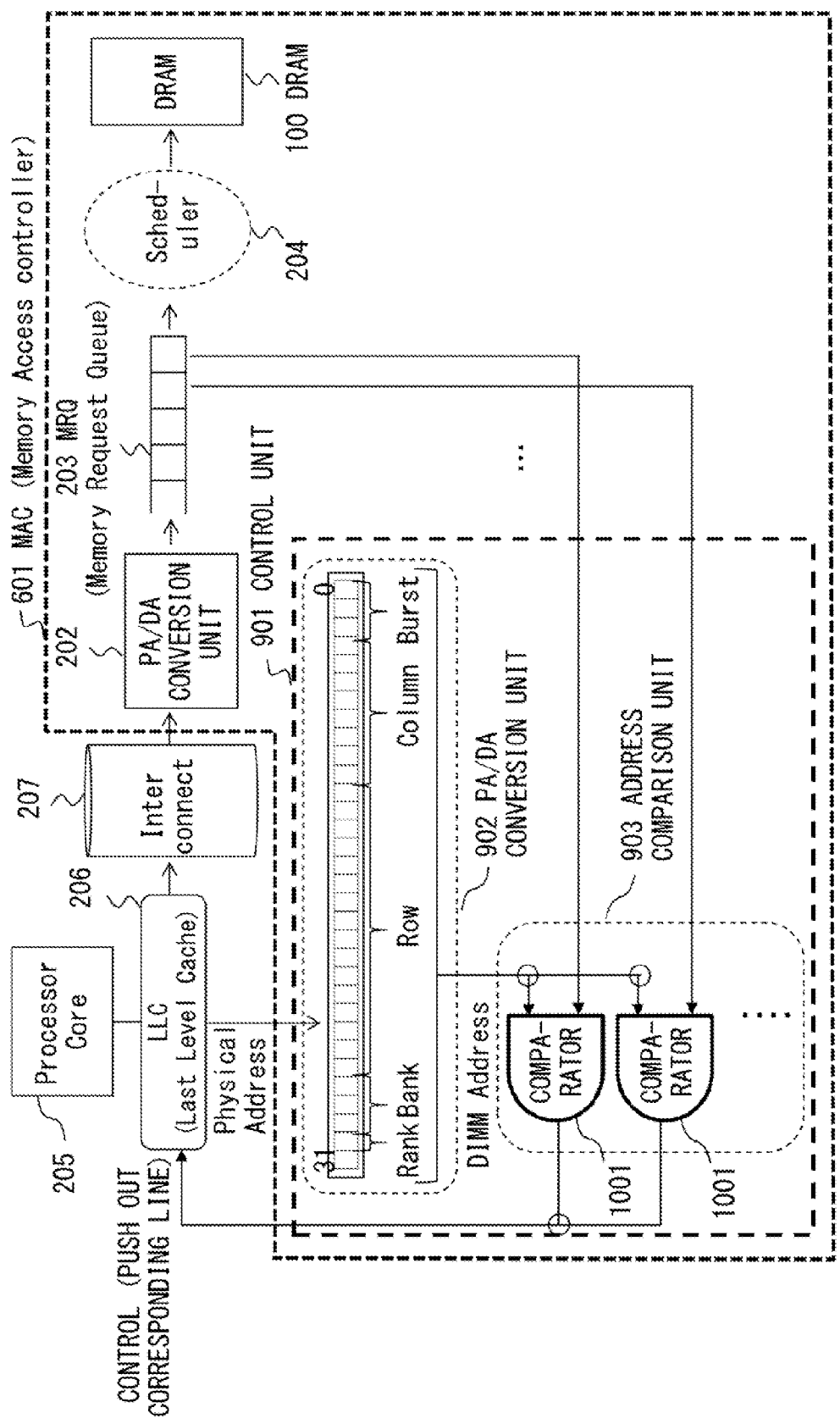
FIG. 10 is a configuration of the hardware according to an embodiment of the present invention.

FIG. 10 is a configuration of the hardware more practical than the configuration in FIG. 9 according to the embodiment of the present invention.

In FIG. 10, the component for performing the same process as the configuration in FIGS. 2 and 9 is assigned the same reference numeral. In FIG. 10, the configurations of the PA/DA conversion unit 902 and the address comparison unit 903 in the control unit 901 are illustrated by practical hardware images. First, the PA/DA conversion unit 902 accesses each LRU position in the push-out target range 702 (FIG. 8) of the LLC 206, and sequentially inputs a 32-bit physical address PA. Then, the input 32-bit address is divided into 5 address types of rank, bank, row, column, and burst as indicated by the reference numeral 902 in FIG. 10. The assignment of bit to a divided address is determined based on the specification of the DRAM 100. Then, the PA/DA conversion unit 902 extracts the address portion (for example, a row address portion) corresponding to the DIMM address DA in the above-mentioned divided addresses, and outputs it to the address comparison unit 903. The address comparison unit 903 includes a comparator 1001 corresponding to each entry of the MRQ 203. The comparator 1001 is a logical circuit group for comparing in a bit unit whether or not the DIMM address DA output from the PA/DA conversion unit 902 matches the DIMM address DA input from one entry of the MRQ 203. In this case, in the FR-FCFS system, it is possible to make valid only the output of the entry of the MRQ 203 which is predicted to be opened in the row buffer 102 in the near future. In addition, the comparator 1001 can be configured so that only the comparator 1001 corresponding to the entry in the MRQ 203 which is determined to be opened in the near future in the control unit 901 can be placed in the on state. It is not always necessary that there is one entry in the MRQ 203 which is determined to be opened in the future, but the configuration can be made so that the outputs of plural upper entries in the opening order can be input to the respective comparators 1001 for comparison. When any comparator 1001 detects a matching result, the data of the physical address PA in the LRU position specified on the LLC 206 at the time point can be nullified and pushed out according to the matching output signal. Since the pushed out physical address PA has been already stored in the MRQ 203, it is not necessary to newly store it in the MRQ 203.

With the configuration illustrated in FIG. 10, the physical address PA in the push-out target range 702 of the LLC 206 having the same DIMM address DA as the entry in the MRQ 203 for which there is a high probability that the row buffer 102 is opened in the future is pushed out, PA/DA converted, and stored in the MRQ 203. Thus, there is a high probability that the data including the data to be pushed out from the LLC 206 having the same DIMM address DA is collectively handled in the accessing process on the row buffer 102.

As a result, the cache line replacing process and the memory access scheduling process capable of performing high-speed access with the precharge frequency in the DRAM 100 reduced can be realized. It is necessary supply power to the memory array 101 to performing precharge. Therefore, by reducing the precharge frequency with the configuration according to the present embodiment, the power consumption of the DRAM 100 can be suppressed.

In the present embodiment, not the data least used based on the LRU, but the M-th data which can be accessed in the near future is pushed out, thereby possibly raising the cache mishit rate (1<M<N where N is the association level of the cache). However, although the DRAM 100 is accessed after a cache mishit arises, the precharge frequency is at maximum as high as the case before the control system is applied according to the present embodiment, thereby reducing the power consumption of the DRAM 100.

Described below is the method of setting the push-out target range 702 illustrated in FIG. 8.

First, the method of statically setting the push-out target range 702 can be adopted. In the static method, the push-out target range 702 is determined in advance by, for example, determining the range as ¼, ½, or all of the number of cache ways of the LLC 206, and then the range is not changed during the operation.

The method of dynamically setting the push-out target range 702 is also adopted. Depending on the programs, a cache mishit frequently occurs when the push-out target range 702 is defined as ½, but it does not occur when it is defined as ¼. Then, depending on the characteristics of the cache mishit of a program, the push-out target range 702 is determined. By dynamically changing the push-out target range 702 during the execution depending on the behavior of the program, a high power consumption reduction effect is acquired while avoiding the degradation of the performance with higher cache mishit frequency.

The push-out target range 702 affects the power consumption reduction effect of the DRAM 100 and the increase in cache mishit frequency (degradation of performance). Generally, when the push-out target range 702 is large, the power consumption reduction effect is high, and the possibility that the cache mishit frequency rises becomes high (the possibility that the performance degrades becomes high). On the other hand, when the push-out target range 702 is small, the power consumption reduction effect is low, and the possibility that the cache mishit frequency rises becomes low (the possibility that the performance degrades becomes low).

FIG. 11 is an explanatory view of the system of determining a push-out target range depending on the feature of cache mishit. A method of checking whether or not where in each LRU position a cache mishit occurs by executing a program in advance can be adopted. For example, as illustrated in FIG. 11, there is the method of setting the threshold of a hit rate by setting the push-out target range 702 if the cache hit rate is 20% or less, etc. Otherwise, the method of determining the push-out target range based on the result of checking in advance before executing a program can be adopted. In this case, the size of the push-out target range can be specified by a user or specified by an execution code by a compiler, etc.

Furthermore, the method of executing a program, measuring the cache hit rate in each LRU position in a somewhat large unit such as a function prepared by a user, and determining the push-out target range 702 for each function using the method as illustrated in FIG. 11 can also be adopted. It is also possible to insert a code for operating a register for specifying the push-out target range 702 into a execution code by recompiling the program. The push-out target range 702 can be dynamically switched if the register for dynamically maintaining the push-out target range is changed by the program itself while the program is being executed.

The present embodiment can reduce the precharge frequency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A storage control system comprising:
a first storage unit that enables to read and write data in a specified data length unit;
a second storage unit that reads any piece of the data in the specified data length unit from the first storage unit and stores the data;
a third storage unit that extracts and stores a part of the data stored in the second storage unit as partial data; and
a processor that performs a process including:
setting to Least Recently Used position of the third storage unit a deletable range in which the partial data or updated partial data obtained by updating the partial data is deletable;
changing a size of the deletable range in accordance with a probability that data to be accessed in response to an access request to the first storage unit is stored in the third storage unit;
reading extraction source data of the partial data from the first storage unit, stores the extraction source data in the second storage unit, partially overwrites the extraction source data using the partial data or the updated partial data, and then writes the extraction source data to the first storage unit when the partial data or the updated partial data is deletable from the deletable range in the third storage unit, and when the extraction source data of the partial data is not stored in the second storage unit;
partially overwriting the extraction source data of the partial data stored in the second storage unit using the partial data or the updated partial data when the extraction source data of the partial data is stored in the second storage unit, and then writes the extraction source data to the first storage unit; and
deleting the partial data or the updated partial data whose extraction source data is stored in the second storage unit on a priority basis from the deletable range in the third storage unit, wherein changing the size of the deletable range includes changing a size of the deletable range for each function in accordance with a cache hit rate in each of Least Recently Used positions, measured in units of the functions determined by a user.

2. The storage control system according to claim 1, wherein the third storage unit stores first data having oldest timing of last write or update and second data having second oldest timing, and when the second storage unit stores one of extraction source data of the first data and extraction source data of the second data, one of the first and second data corresponding to the extraction source data stored in the second storage unit is selected on a priority basis as the data to be deleted.

3. A replacing system comprising:
a first storage unit that enables to read and write data in a specified data length unit;
a second storage unit that reads any piece of the data in the specified data length unit from the first storage unit and stores the data;
a third storage unit that extracts and stores a part of the data stored in the second storage unit as partial data; and
a processor that executes a procedure, the procedure including:
setting to Least Recently Used position of the third storage unit a deletable range in which the partial data or updated partial data obtained by updating the partial data is deletable;
changing a size of the deletable range in accordance with a probability that data to be accessed in response to an access request to the first storage unit is stored in the third storage unit;
predicting data at which storage address of the first storage unit is stored in the second storage unit when the partial data or the updated partial data is deletable from the deletable range in the third storage unit;
converting each address of one or more pieces of the partial data and the updated partial data which are deletable from the deletable range in the third storage unit into each address on the first storage unit; and
detecting matching of address portions in the specified data length unit based on each of a converted address and a predicted data address, and deleting the partial data or the updated partial data corresponding to a matching detected address on a priority basis from the deletable range in the third storage unit, wherein
changing the size of the deletable range includes changing a size of the deletable range for each function in accordance with a cache hit rate in each of Least Recently Used positions, measured in units of the functions determined by a user.

4. The replacing system according to claim 3, the replacing system further comprising
a memory request queue that temporarily holds access requests of data to be read from the first storage unit to the second storage unit for a specified number of requests, wherein
the processor reads temporarily hold requests in the memory request queue in accordance with a specified rule, thereby reading data corresponding to the requests from the first storage unit to the second storage unit, performs an accessing process collectively on a plurality of requests having matching addresses in the specified data length unit in the temporarily held requests in the memory request queue, determines a request to be next read from the memory request queue, thereby predicting data at which storage address in the first storage unit is to be stored in the second storage unit.

5. The replacing system according to claim 4, wherein the processor deletes the partial data or the updated partial data corresponding to the matching detected address on a priority basis from the deletable range in the third storage unit, and stores in the memory request queue a request to write back the partial data or the updated partial data to the first storage unit.

6. A storage control method by a processor, the storage control method comprising:
writing and reading data in a specified data length unit to and from a first storage unit by the processor;
reading any piece of the data in the specified data length unit from the first storage unit and storing the data in a second storage unit by the processor;
extracting a part of the data stored in the second storage unit as partial data and storing the partial data in a third storage unit by the processor;
setting to Least Recently Used position of the third storage unit a deletable range in which the partial data or updated partial data obtained by updating the partial data is deletable by the processor;
changing a size of the deletable range in accordance with a probability that data to be accessed in response to an access request to the first storage unit is stored in the third storage unit;
reading extraction source data of the partial data from the first storage unit, storing the extraction source data in the second storage unit, partially overwriting the extraction source data using the partial data or the updated partial data, and then writing the extraction source data to the first storage unit by the processor when the partial data or the updated partial data is deletable from the deletable range in the third storage unit, and when the extraction source data of the partial data is not stored in the second storage unit;
partially overwriting the extraction source data of the partial data stored in the second storage unit by the processor using the partial data or the updated partial data when the extraction source data of the partial data is stored in the second storage unit, and then writing the extraction source data to the first storage unit by the processor, and
deleting the partial data or the updated partial data whose extraction source data is stored in the second storage unit on a priority basis from the deletable range in the third storage unit by the processor, wherein
changing the size of the deletable range includes changing a size of the deletable range for each function in accordance with a cache hit rate in each of Least Recently Used positions, measured in units of the functions determined by a user.

7. A cache memory replacing method by a processor, the cache memory replacing method comprising:
writing and reading data in a specified data length unit to and from a first storage unit by the processor;
reading any piece of the data in the specified data length unit from the first storage unit and storing the data in a second storage unit by the processor;
extracting a part of the data stored in the second storage unit as partial data and storing the partial data in a third storage unit by the processor;
setting to Least Recently Used position of the third storage unit a deletable range in which the partial data or updated partial data obtained by updating the partial data is deletable by the processor;

changing a size of the deletable range in accordance with a probability that data to be accessed in response to an access request to the first storage unit is stored in the third storage unit;

predicting data at which storage address in the first storage unit is stored in the second storage unit by the processor when one of the partial data and the updated partial data is deletable from the deletable range in the third storage unit;

converting each address of the partial data or the updated partial data which is deletable from the deletable range in the third storage unit into each address on the first storage unit by the processor; and detecting matching of address portions in the specified data length unit based on each of a converted address and a predicted data address, and deleting the partial data or the updated partial data corresponding to a matching detected address on a priority basis from the deletable range in the third storage unit by the processor, wherein changing the size of the deletable range includes changing a size of the deletable range for each function in accordance with a cache hit rate in each of Least Recently Used positions, measured in units of the functions determined by a user.

* * * * *